United States Patent
Nishi et al.

(10) Patent No.: US 7,691,686 B2
(45) Date of Patent: Apr. 6, 2010

(54) SEMICONDUCTOR DEVICE AND MANUFACTURING METHOD THEREOF

(75) Inventors: Kazuo Nishi, Kofu (JP); Junya Maruyama, Ebina (JP); Naoto Kusumoto, Isehara (JP); Yuusuke Sugawara, Minamiarupusu (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 516 days.

(21) Appl. No.: 11/579,141

(22) PCT Filed: May 16, 2005

(86) PCT No.: PCT/JP2005/009285
§ 371 (c)(1),
(2), (4) Date: Oct. 30, 2006

(87) PCT Pub. No.: WO2005/114749
PCT Pub. Date: Dec. 1, 2005

(65) Prior Publication Data
US 2008/0001148 A1    Jan. 3, 2008

(30) Foreign Application Priority Data
May 21, 2004    (JP)    ............................ 2004-152160

(51) Int. Cl.
*H01L 21/00*    (2006.01)
*H01L 21/84*    (2006.01)
(52) U.S. Cl. .......................................... 438/149; 257/59
(58) Field of Classification Search ................... 257/59; 438/149
See application file for complete search history.

(56) References Cited

U.S. PATENT DOCUMENTS
6,392,217 B1    5/2002    Teranuma et al.
(Continued)

FOREIGN PATENT DOCUMENTS
CN    1256791    6/2000
(Continued)

OTHER PUBLICATIONS
Office Action (Application No. 200580024505.0) dated Jun. 6, 2008. Full.
(Continued)

*Primary Examiner*—Eugene Lee
*Assistant Examiner*—Anthony Ho
(74) *Attorney, Agent, or Firm*—Eric J. Robinson; Robinson Intellectual Property Law Office, P.C.

(57) ABSTRACT

An object of the present invention to provide a semiconductor device manufactured in short time by performing the step of forming the thin film transistor and the step of forming the photoelectric conversion layer in parallel, and to provide a manufacturing process thereof. According to the present invention, a semiconductor device is manufactured in such a way that a thin film transistor is formed over a first substrate, a photoelectric conversion element is formed over a second substrate, and the thin film transistor and the photoelectric conversion element are connected electrically by sandwiching a conductive layer between the first and second substrates opposed to each other so that the thin film transistor and the photoelectric conversion element are located between the first and second substrates. Thus, a method for manufacturing a semiconductor device which suppresses the increase in the number of steps and which increases the throughput can be provided.

7 Claims, 11 Drawing Sheets

U.S. PATENT DOCUMENTS

| | | |
|---|---|---|
| 6,424,326 B2 | 7/2002 | Yamazaki et al. |
| 6,627,518 B1 | 9/2003 | Inoue et al. |
| 6,828,951 B2 | 12/2004 | Yamazaki et al. |
| 6,949,749 B2 | 9/2005 | Tokuda et al. |
| 2001/0028060 A1 | 10/2001 | Yamazaki et al. |
| 2002/0014593 A1 | 2/2002 | Tokuda et al. |
| 2002/0180672 A1 | 12/2002 | Yamazaki et al. |
| 2004/0251461 A1 | 12/2004 | Anzai et al. |
| 2005/0056841 A1 | 3/2005 | Yamazaki et al. |
| 2005/0056842 A1 | 3/2005 | Nishi et al. |

FOREIGN PATENT DOCUMENTS

| | | |
|---|---|---|
| CN | 1272181 | 11/2000 |
| EP | 0 986 104 | 3/2000 |
| EP | 1 020 748 | 7/2000 |
| JP | 11-251517 | 9/1999 |
| JP | 2001-265283 | 9/2001 |
| JP | 2002-064194 | 2/2002 |
| JP | 2002-228759 | 8/2002 |
| JP | 2003-298012 | 10/2003 |
| WO | 1999/017142 | 4/1999 |

OTHER PUBLICATIONS

International Search Report (Application No. PCT/JP2005/009285) dated Aug. 30, 2005.
Written Opinion (Application No. PCT/JP2005/009285) dated Aug. 30, 2005.

SEMICONDUCTOR DEVICE AND MANUFACTURING METHOD THEREOF

TECHNICAL FIELD

The present invention relates to a semiconductor device and a manufacturing method thereof. The present invention particularly relates to a semiconductor device with a photo sensor mounted.

BACKGROUND ART

Photo sensors are used to control switching on and off by sensing light or to control the illuminance of backlights of cellular phones and the like. Further, photo sensors are used as sensors for converting video pictures or graphics into electrical signals in a fax machine, a photocopier, a video camera, a digital still camera, and the like.

Photo sensors convert light into electrical signals in such a way that photo charges generated by irradiating a photoelectric conversion layer with light are outputted as an electric current in accordance with the amount of irradiation light. When slight difference of the photo charges between the respective photoelectric conversion layers is difficult to be expressed as signals, it is necessary to amplify the outputted signals with a circuit for amplifying the photo charges (hereinafter referred to as an amplifier circuit) so that the slight difference can be clarified.

In the case of manufacturing a photo sensor equipped with the amplifier circuit, a thin film transistor 1102 is first formed as an element constituting a part of the amplifier circuit over a substrate 1101 as shown in FIGS. 11A and 11B. Next, a cathode electrode 1103 of a photoelectric conversion element 1106 is stacked so as to connect with a source electrode or a drain electrode of the thin film transistor. After that, a silicon layer 1104 and an anode electrode 1105 are formed over the cathode electrode 1103, and thus the photo sensor is manufactured. Such a method is common to form the photo sensor (for example, Reference 1: Japanese Patent Document Laid-Open No. 2001-265283, FIG. 13).

DISCLOSURE OF INVENTION

Conventionally, the photo sensor equipped with an element constituting a part of the amplifier circuit (hereinafter also referred to as an amplifier element) has been manufactured in such a way that after forming the thin film transistor 1102 over the substrate 1101 as shown in FIGS. 11A and 11B, a photoelectric conversion element 1106 is formed. Therefore, since it consumes a large amount of time to complete the photo sensor, the throughput has been low.

In addition, since the photoelectric conversion element 1106 is formed over the thin film transistor 1102, the photoelectric conversion element 1106 is affected by unevenness due to the thin film transistor. Therefore, when the photoelectric conversion element is provided so as to avoid an uneven portion due to the thin film transistor, a light-reception area decreases, and capability of detecting the light decreases. Consequently, it has been required to enhance the capability of detecting the light.

Moreover, when the amplifier circuit is formed using thin film transistors, the substrate has the restriction. For example, when a semiconductor film is formed with silicon, a heating step at comparatively high temperature, for example 500° C. or more, is required to crystallize or activate silicon. For this reason, the substrate is limited to a glass or quartz substrate having heat resistance, which leads to problems that the volume of parts and the weight of the photo sensor increase.

Moreover, since the glass substrate and the quartz substrate are not flexible, the photo sensor formed using these substrates cannot be mounted to a curved surface but can be mounted only to a flat portion.

In view of the above problems, it is a first object of the present invention to shorten a manufacturing process of a semiconductor device and to increase the capability of detecting the light. Moreover, it is a second object of the present invention to achieve a semiconductor device manufactured over a desired substrate, a manufacturing method thereof, and a thin and lightweight semiconductor device.

According to one feature of the present invention, a thin film transistor is formed over a first substrate, and a photoelectric conversion element is formed over a second substrate. Then, a semiconductor device having a photo sensor is manufactured by sandwiching the thin film transistor and the photoelectric conversion element between the first substrate and the second substrate so that the photoelectric conversion element and the thin film transistor are electrically connected. Moreover, the thin film transistor over the first substrate constitutes a part of a circuit for amplifying the output of the photoelectric conversion element.

Further, after electrically connecting the thin film transistor and the photoelectric conversion element as above, the first substrate is peeled from the thin film transistor while keeping the photoelectric conversion element and the thin film transistor held by the second substrate.

After peeling the first substrate, the semiconductor device may be mounted to an object. Alternatively, the semiconductor device may be mounted to the object after a flexible substrate such as a resin substrate or a print substrate is pasted as a third substrate to the semiconductor device from which the first substrate has been peeled.

When a substrate having heat resistance, typically a glass substrate or a quartz substrate, is used as the first substrate, a thin film transistor for the amplifier circuit having high electrical characteristic can be obtained because the thin film transistor can be manufactured at high temperature. However, a plastic substrate or a substrate formed with an organic resin material which does not have heat resistance may also be used as a first substrate as long as the thin film transistor serving as the amplifier circuit can be manufactured.

As the material for the second substrate, glass, quartz, plastic, or organic resin material is given. Typically, a plastic substrate formed with PET (polyethylene terephthalate), PEN (polyethylene naphthalate), PES (polyethersulfone), polypropylene, polypropylene sulfide, poly carbonate, polyetherimide, polyphenylene sulfide, polyphenylene oxide, polysulfone, polyimide, or polyphthalamide is given. Moreover, a member formed with an organic resin, typically a surface of a package with an IC chip enclosed can be used as the substrate. Further, the surface of the second substrate does not need to be flat, and the surface thereof may be uneven or curved.

The semiconductor device manufactured according to the present invention may sense light emitted from a side of the first substrate where the element constituting a part of the amplifier circuit is formed, or may sense light emitted from a side of the second substrate where the photoelectric conversion element is formed. However, when the light from the side of the first substrate is to be received, it is necessary that not only the first substrate but also layers through which the light passes until reaching the photoelectric conversion layer have high light-transmitting properties. Meanwhile, when the light from the side of the second substrate is to be received, the second substrate and the cathode electrode are formed with the material having high light-transmitting properties.

A photoelectric conversion element according to the present invention can use a Schottky diode, a PIN or PN type diode, an avalanche diode, or the like in which a photoelectric conversion layer is sandwiched between an anode electrode and a cathode electrode as a photo diode.

A semiconductor device manufactured according to the present invention has a photo sensor, a photoelectric conversion element, or a solar battery element. In the present invention, the semiconductor device comprises a semiconductor element having an amorphous semiconductor film as an active layer or a semiconductor element having a crystalline semiconductor film as the active layer. Specifically, the semiconductor device comprises a photo sensor element, a photoelectric conversion device, a solar battery, or the like.

According to the present invention, the thin film transistor is formed over the first substrate, and the photoelectric conversion element is formed over the second substrate. These first and second substrates are provided so as to oppose to each other, and the thin film transistor and the photoelectric conversion element between these substrates are electrically connected. Thus, a semiconductor device having the photo sensor can be manufactured. For this reason, the photoelectric conversion element can be formed without waiting for the formation of the thin film transistor, differently from the conventional way; therefore, the manufacturing time can be shortened.

Further, since the substrate can be peeled after connecting the thin film transistor and the photoelectric conversion element electrically, the semiconductor film can be made thinner and more lightweight. When a flexible substrate such as a plastic substrate is pasted thereto after peeling the substrate, a flexible semiconductor device which can resist bending and twisting and in which impact resistance is improved can be achieved. Since the flexible semiconductor device can be mounted to any kind of objects, the semiconductor device can be mounted to an uneven surface or a curved surface.

A semiconductor device according to the present invention is manufactured by electrically connecting the thin film transistor and the photoelectric conversion element, after forming them individually. Therefore, since the photoelectric conversion element can be formed without being restricted by the unevenness due to the thin film transistor or other restrictions due to the design, the photoelectric conversion element with large light-reception area can be provided over the amplifier circuit. Therefore, a semiconductor device with high capability of detecting the light can be achieved.

BEST MODE FOR CARRYING OUT THE INVENTION

Embodiment Mode

Embodiment modes and embodiments are hereinafter described with reference to drawings. However, since the present invention can be embodied in many different modes, it is easily understood by those skilled in the art that the modes and details of the present invention can be changed and modified within the content and scope of the present invention. Therefore, the present invention is not limited to the description of the embodiment modes and embodiments.

Embodiment Mode 1

With reference to FIGS. 1A to 1D, this embodiment mode describes an example in which a photoelectric conversion element is formed over one substrate, while an element constituting a part of an amplifier circuit is formed over the other substrate, and in which the photoelectric conversion element and the amplifier element are connected electrically.

Figure 1A:
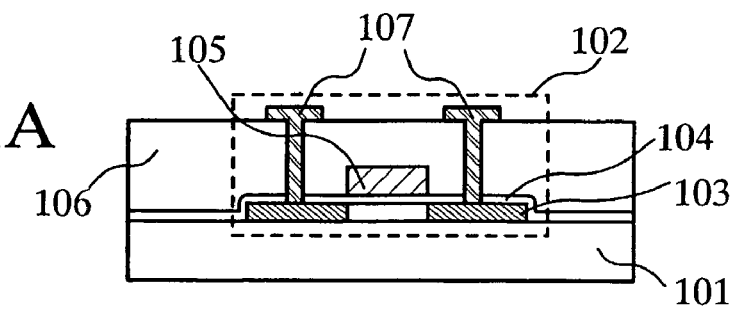
FIGS. 1A to 1D show Embodiment Mode 1 of the present invention.

First, the amplifier element or the amplifier circuit is formed over a first substrate 101 shown in FIG. 1A. Here, a thin film transistor 102 is formed as a typical example of the amplifier element. Although FIG. 1A illustrates a top-gate type thin film transistor, a bottom-gate type thin film transistor may also be used.

The thin film transistor 102 comprises a semiconductor layer 103, a gate insulating film 104, a gate electrode 105, an interlayer insulating film 106, and a source or drain electrode 107.

Figure 1B:
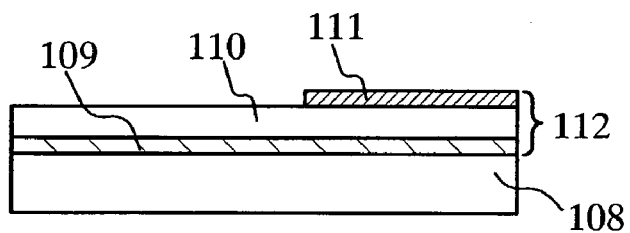

Moreover, as shown in FIG. 1B, a photoelectric conversion element 112 comprising a cathode electrode 109, a silicon layer 110, and an anode electrode 111 is formed over a second substrate 108 separately from the first substrate. However, the structure of the photoelectric conversion element is not limited to that shown in this embodiment mode, and the photoelectric conversion element may have any structure as long as the photoelectric conversion element has a function of outputting light as signals.

Next, the first substrate and the second substrate are opposed to each other so that the thin film transistor and the photoelectric conversion element are sandwiched between the first and second substrates, and the thin film transistor and the photoelectric conversion element are connected electrically. This electric connection is to amplify the output of the photoelectric conversion element in the thin film transistor. As an electric connection method, a conductive material is sandwiched between the thin film transistor and the photoelectric conversion element. Further, by using a conductive material having a function of an adhesion bond, the thin film transistor and the photoelectric conversion element are connected electrically at the same time as pasting the substrates. Specifically, two connection methods are given as described below.

Figure 1C:
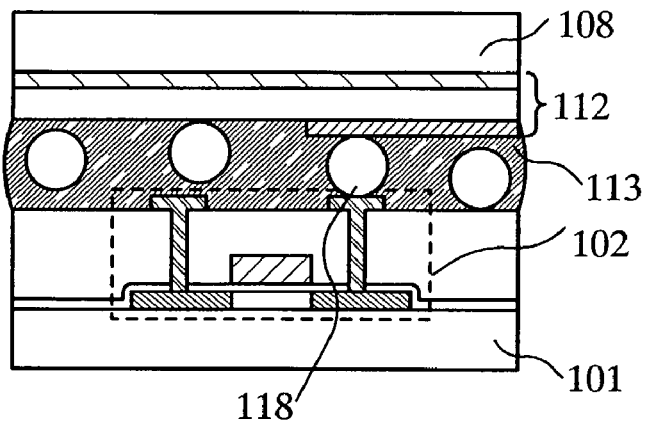

One is a connection method using a conductive adhesion bond. FIG. 1C shows a semiconductor device manufactured by this method. A conductive adhesion bond is usually formed with a resin material in which conductive particles are dispersed. This resin material has properties in which the electric connection is carried out only in a direction of the film thickness, and the electric connection is not carried out in a direction of the surface. As the conductive adhesion bond, an anisotropic conductive adhesion bond is given, and specifically an anisotropic conductive film or an anisotropic conductive paste is given. The anisotropic conductive paste is used in this embodiment mode. After applying an anisotropic conductive paste 113 to the thin film transistor 102, the first substrate 101 and the second substrate 108 are pasted so that the photoelectric conversion element 112 and the thin film transistor 102 are located between the first and second substrates. Alternatively, the first and second substrates 101 and 108 may be pasted after applying the anisotropic conductive paste 113 to the photoelectric conversion element 112.

In the case of pasting with the anisotropic conductive paste 113, only the anode electrode 111 and the source or drain electrode 107 can be connected electrically with conductive particles 118 simultaneously as adhering the first and second substrates. With the above process, a semiconductor device having the photo sensor can be manufactured.

Figure 1D:
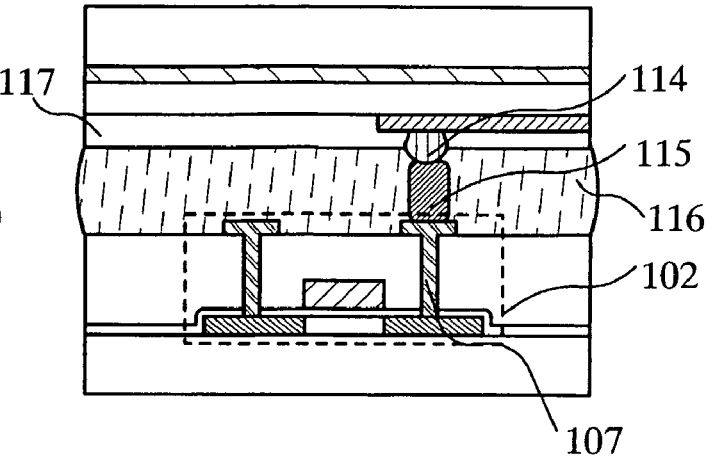

As the other method, a connection method using a metal layer is given. As an example, a method using solder 115 is given as shown in FIG. 1D. In the case of solder, the thin film transistor and the photoelectric conversion element are connected through a metal that can form alloy with solder, that is, a metal having wettability to solder (hereinafter referred to as a wettable metal). Therefore, the source or drain electrode 107 is formed with the wettable metal in the thin film transistor 102, or the wettable metal film is formed over the surface of the source or drain electrode 107. Moreover, in the photoelectric conversion element, an insulating film 117 is formed, and an electrode 114 is formed with the wettable metal in a contact hole formed in the insulating film 117.

In addition, there is another method in which, by forming the anode electrode 111 with the wettable metal or forming only the surface of the anode electrode 111 with the wettable metal, the anode electrode 111 and the solder are directly connected without forming the electrode 114.

Then, the source or drain electrode 107 and the electrode 114 are soldered by a solder reflow process or the like so that the thin film transistor and the photoelectric conversion element are electrically connected. Next, parts except the solder 115 are sealed with a sealing material 116 so that the first and second substrates are adhered. Since the solder reflow process is performed at approximately 250° C., the first and second substrates need to have heat resistance that can resist this temperature. For example, a glass substrate, a quartz substrate, or a heat-resistant plastic substrate is preferable.

In the above two methods, the material having conductivity and adhesion function is sandwiched between the thin film transistor and the photoelectric conversion element so that the first and second substrates are pasted. However, the material sandwiched between the thin film transistor and the photoelectric conversion element does not necessarily have both the conductivity and adhesion function, and need to have at least the conductivity. When the material having only the conductivity is sandwiched, the substrates are preferably pasted by using some kind of means, for example by applying an adhesion bond to a side surface of the semiconductor device.

As thus described, the thin film transistor constituting a part of the amplifier element or the amplifier circuit is formed over the first substrate, and the photoelectric conversion element is formed over the second substrate. This makes it possible to perform two steps of forming the thin film transistor and forming the photoelectric conversion element independently in parallel. Therefore, the semiconductor device can be manufactured effectively in short time according to the present invention.

Moreover, the semiconductor device can be completed by connecting these elements electrically after confirming the performance of each element at the time of completion of forming the thin film transistor or the photoelectric conversion element. Therefore, the proportion in which defective items are manufactured can be suppressed, and the yield can be improved.

Furthermore, since the photoelectric conversion element can be formed separately from the thin film transistor, the light-reception area can be enlarged without being affected by the restriction due to the design, such as the unevenness due to the thin film transistor. Consequently, the capability of detecting the light of the photoelectric conversion element can be enhanced.

Embodiment Mode 2

With reference to FIGS. 2A to 2D, this embodiment mode describes a method for peeling the first substrate from the semiconductor device manufactured in Embodiment Mode 1. In FIGS. 2A to 2D, the same parts as those in FIGS. 1A to 1D are denoted with the same reference numerals, and the description to such parts is omitted.

First, a peeling layer 201 is formed over the first substrate 101 before forming the thin film transistor 102 described in FIG. 1A over the first substrate 101. Then, the thin film transistor 102 is formed over the peeling layer 201.

The second substrate having the photoelectric conversion element shown in FIG. 1B and the first substrate having the thin film transistor formed thus are pasted with a conductive adhesion bond. Although the anisotropic conductive paste is used here, the first substrate and the second substrate may be pasted with solder as shown in FIG. 1D.

Figure 2A:
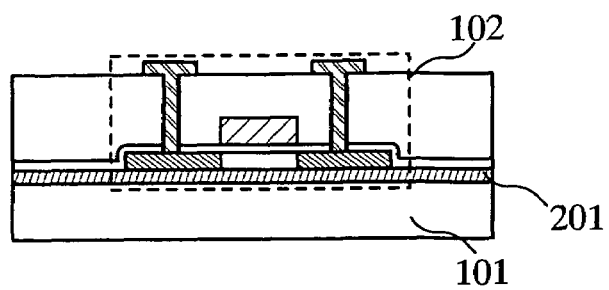
FIGS. 2A to 2D show Embodiment Mode 2 of the present invention.
Figure 2B:
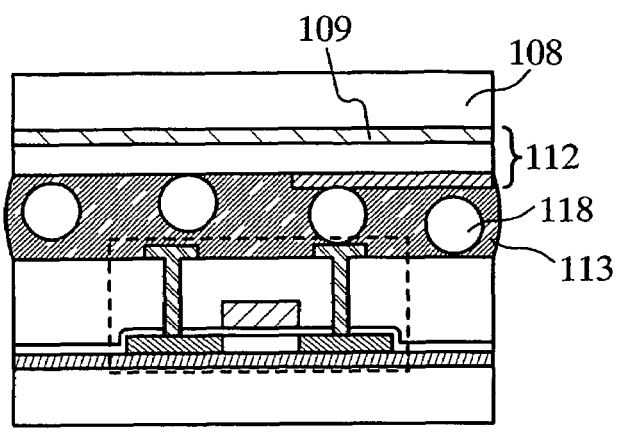
Figure 2C:
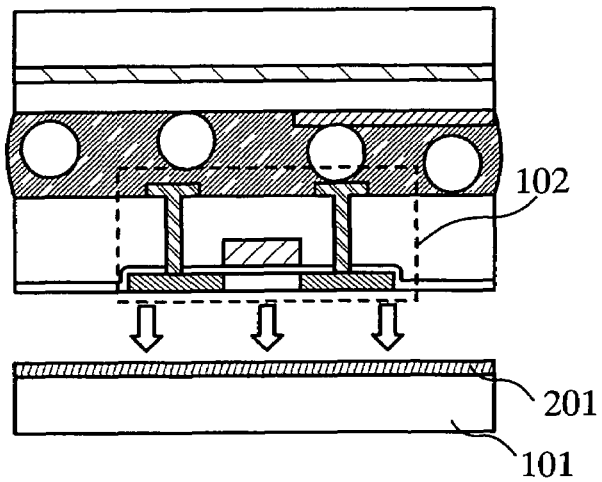

After obtaining the state of FIG. 2B in which the photoelectric conversion element and the thin film transistor are held by the second substrate 108, the first substrate 101 is peeled from the thin film transistor 102. In FIG. 2C, the first substrate 101 is peeled from the interface between the peeling layer and the semiconductor layer. However, the present invention is not limited to this, and the first substrate 101 may be peeled from the interface between the first substrate and the peeling layer. Alternatively, the peeling layer itself may be divided into two. As a peeling method, dry etching, wet etching, or a general method in which, for example, pulling stress is applied may be used.

Figure 2D:
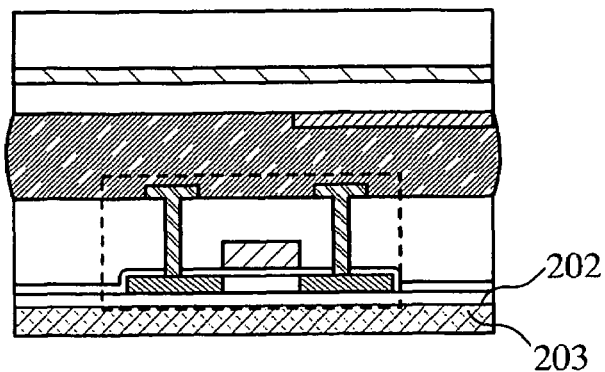

In the state of FIG. 2C in which the first substrate is peeled, the photoelectric conversion element equipped with the thin film transistor 102 may be mounted directly to the object. Moreover, as shown in FIG. 2D, a third substrate 203 may be pasted to the thin film transistor 102 through an adhesion bond 202. At this time, in the case of receiving the light from a side of the third substrate, a material having high light-transmitting properties is used for the third substrate 203 and the adhesion bond 202.

According to the peeling step, the first substrate can be peeled from the semiconductor device. Therefore, a lightweight and thin semiconductor device can be provided. Further, when a resin substrate or the like is used as the third substrate, a lightweight and thin semiconductor device which has flexibility can be provided. When a flexible substrate is used as the third substrate, mount strength with respect to the object can be increased compared with the semiconductor device formed using the glass substrate or the quartz substrate not having flexibility.

Moreover, the second substrate 108 may be peeled by providing a peeling layer between the second substrate 108 and the cathode electrode 109. Further, after peeling the second substrate, a fourth substrate may be pasted onto the cathode electrode 109 with the adhesion bond. When the light emitted from a side of the fourth substrate is to be received, the adhesion bond and the fourth substrate are formed with a material having high light-transmitting properties in order to transmit the light to be received.

When the first and second substrates are peeled, a thinner and more lightweight semiconductor device can be provided.

Generally, a technique for peeling the substrate and pasting a new substrate is referred to as a transposition technique. In the case of the transposition, a support substrate is necessary to support the photoelectric element and the thin film transistor during the peeling of the substrate. However, according to the present invention, the support substrate is not necessary because the first substrate or the second substrate can be used as the support substrate. Therefore, the substrate can be transposed without preparing a new substrate, and a semiconductor device having the thin film transistor, which constitutes a part of the amplifier circuit, can be manufactured over a plastic substrate or an organic resin member effectively.

Embodiment 1

This embodiment describes a step of connecting a photoelectric conversion element and an amplifier element electrically with the use of the anisotropic conductive paste shown in Embodiment Mode 1 more specifically with reference to FIGS. 3A to 3D.

First, an oxide film, which is the first layer of a base insulating film 302, is formed over a glass substrate to form an element over the glass substrate (a first substrate 301). In this embodiment, a silicon oxide film is formed by a sputtering method (in 150 to 200 nm thick).

Subsequently, a silicon oxynitride film, which is the second layer of the base insulating film 302, is formed in 100 nm thick by a PCVD method. After that, without exposing the substrate to the air, an amorphous silicon film including hydrogen is formed in 54 nm thick. It is to be noted that the silicon oxynitride film serves as a blocking layer to prevent the diffusion of an impurity element such as an alkali metal from the glass substrate.

Next, the above amorphous silicon film is crystallized by a known method (such as a solid-phase growth method, a laser crystallizing method, a crystallization method using a catalyst metal, or the like) so that an element using a thin film transistor (hereinafter also referred to as a TFT) which has a poly-silicon film as an active layer is formed. In this embodiment, the poly-silicon film is obtained by the crystallizing method using the catalyst metal. Specifically, a nickel acetate solution including nickel by 10 ppm in weight is applied to the above amorphous silicon film by a spinner. Alternatively, the nickel element may be sprayed to the whole surface of the above amorphous silicon film by the sputtering method. After that, the amorphous silicon film is crystallized by performing heat treatment and a semiconductor film having a crystal structure (here a poly-silicon film) is formed. In this embodiment, after heat treatment (for an hour at 500° C.), a silicon film having the crystal structure is obtained by performing another heat treatment (for four hours at 550° C.) for the crystallization.

Next, after removing the oxide film on the surface of the silicon film having the crystal structure by dilute hydrofluoric acid or the like, the laser beam (XeCl: wavelength 308 nm) is delivered under the air or an oxygen atmosphere in order to increase the degree of crystallinity and to repair a defect left in the crystal grain. The excimer laser beam having a wavelength of 400 nm or shorter, or the second or third harmonic of a YAG laser is used. The pulsed laser beam having a pulse repetition rate ranging from approximately 10 to 1000 Hz is delivered and scanned on the surface of the silicon film in such a way that the laser beam is condensed by an optical system so as to have the energy density ranging from 100 to 500 $mJ/cm^2$ and that the overlap ratio is set in the range of 90 to 95%. In this embodiment, the laser irradiation is performed under the air with the condition where the pulse repetition rate is 30 Hz and the energy density is 470 $mJ/cm^2$. It is noted that an oxide film is formed on the surface of the silicon film because the laser irradiation is performed under the air or an oxygen atmosphere. Although the present embodiment shows the example of using the pulsed laser, a continuous wave laser may also be used. In the case of using the continuous wave laser, it is preferable to use a continuous wave solid-state laser and to apply any one of the second to fourth harmonics of the fundamental wave in order to crystallize an amorphous semiconductor film and to obtain large crystal grains. Typically, the second harmonic (532 nm) or the third harmonic (355 nm) of a Nd: $YVO_4$ laser (fundamental wavelength 1064 nm) may be used. In the case of using the continuous continuous wave laser, the laser beam emitted from the continuous wave $YVO_4$ laser is converted into the harmonic having a power of 10 W by a non-linear optical element. The harmonic can also be obtained by putting a $YVO_4$ crystal and the non-linear optical element in the resonator. It is preferable to shape the laser beam into rectangular or elliptical on the irradiation surface through an optical system and the laser beam is delivered to the semiconductor film, which is a processing object. On this occasion, the energy density ranging from approximately 0.01 to 100 $MW/cm^2$ (preferably from 0.1 to 10 $MW/cm^2$) is necessary. Then, the semiconductor film may be irradiated with the laser beam while moving the semiconductor film relative to the laser beam at a speed ranging from approximately 10 to 2000 cm/s.

Then, over the oxide film formed by the above laser irradiation, an oxide film is further formed by processing the surface using ozone water for 120 seconds so that the total thickness of the oxide films range from 1 to 5 nm. The oxide films formed thus serves as a barrier layer. The barrier layer is formed in order to remove the nickel added for the crystallization from the silicon film. Although the barrier layer is formed by using the ozone water in this embodiment, the present invention is not limited to this. The barrier layer may be formed by a method in which the surface of the semiconductor film having the crystal structure is oxidized by the irradiation of the ultraviolet ray under the oxygen atmosphere or a method in which the surface of the semiconductor film having the crystal structure is oxidized through an oxygen plasma process, or by depositing an oxide film in thickness from approximately 1 to 10 nm by a plasma CVD method, a sputtering method, or an evaporation method. The oxide film formed by the laser irradiation may be removed before forming the barrier layer.

Subsequently, an amorphous silicon film including an argon element to become a gettering site is formed in thickness from 10 to 400 nm over the barrier layer by the sputtering method. In this embodiment, the amorphous silicon film including an argon element is formed in 100 nm thick under an atmosphere including argon using a silicon target. In the case of using a plasma CVD method, the amorphous silicon film including the argon element is formed under the condition where the flow rate of monosilane and argon ($SiH_4$:Ar) is 1:99, the film-forming pressure is 6.665 Pa (0.05 Torr), RF power density is 0.087 W/cm², and the film-forming temperature is 350° C.

After that, the gettering is performed by heat treatment for three minutes in a furnace heated to be 650° C. Thus, the concentration of nickel in the semiconductor film having the crystal structure is decreased. A lamp annealing apparatus may be used instead of the furnace.

Next, after removing selectively the amorphous silicon film including the argon element, which is a gettering site, using the barrier layer as an etching stopper, the barrier layer is removed selectively by dilute hydrofluoric acid. Since the nickel is likely to move to a region where the concentration of oxygen is high in the gettering process, the barrier layer comprising the oxide film is preferably removed after the gettering.

When the semiconductor film is not crystallized using the catalyst element, the steps of forming the barrier layer, forming the gettering site, performing the heat treatment for the gettering, removing the gettering site, removing the barrier layer, and so on are not necessary.

Subsequently, after a thin oxide film is formed on the surface of the obtained silicon film having the crystal structure (also referred to as a poly-silicon film) using the ozone water, a first photo mask is used to form a resist mask, and an etching process is performed so that an island-shaped semiconductor layer 303 is formed. After forming the island-shaped semiconductor layer 303, the resist mask is removed.

Next, an extremely small amount of impurity elements (boron or phosphorus) are added in order to control the threshold of the TFT if necessary. In this embodiment, boron is added to the semiconductor layer 303 by exciting $B_2H_6$ in plasma without mass-separation.

Then, after removing the oxide film by etchant including hydrofluoric acid at the same time as washing the surface of the silicon film, a silicon-based insulating film to become a gate insulating film 304 is formed. A silicon oxynitride film (composition ratio Si=32%, O=59%, N=7%, H=2%) is formed in 115 nm thick by a plasma CVD method.

Next, after forming a metal film over the gate insulating film 304, the metal film is patterned using a second photo mask so that a gate electrode 305 and connection wirings 306, 307, and 308 are formed. Then, a source region or a drain region is formed by doping the active layer.

After a first interlayer insulating film (not shown) comprising a silicon oxide film is formed in 50 nm thick by the CVD method, a process for activating the impurity element added in the respective semiconductor layers is performed. This activation process is performed by a rapid thermal anneal (RTA) method using a lamp as a light source, a method in which a YAG laser or an excimer laser is used, heat treatment using a furnace, or a method in which any one of these is combined with another.

Next, after a second interlayer insulating film 309 formed with a silicon nitride oxide film including hydrogen is formed, heat treatment (for 1 to 12 hours at 300 to 550° C.) is performed to hydrogenate the semiconductor layer. This process is to terminate a dangling bond in the semiconductor layer using the hydrogen included in the first interlayer insulating film. The semiconductor layer 303 can be hydrogenated regardless of the existence of the gate insulating film 304.

Subsequently, a third interlayer insulating film 310 is formed with an organic insulating material over the second interlayer insulating film 309. An acrylic resin film having a thickness of 0.8 μm is formed in this embodiment.

Next, a fourth interlayer insulating film 311 is formed with an inorganic insulating film in thickness from 250 to 350 nm over the third interlayer insulating film 310 by the sputtering method.

Subsequently, a resist mask is formed using a third photo mask, and then a contact hole is formed by etching selectively the first to fourth interlayer insulating films and the gate insulating film 304. Then, the resist mask is removed.

Then, after stacking a metal film, a resist mask is formed using a fourth photo mask. Wirings 312, 313, and 314 and a source or drain electrode 315 of a thin film transistor are formed by etching the stacked metal film selectively. Then, the resist mask is removed. It is to be noted that the stacked metal film has a three-layer structure including a 100-nm-thick Ti film, a 350-nm-thick Al film including an extremely small amount of Si, and another 100-nm-thick Ti film.

Figure 3A:
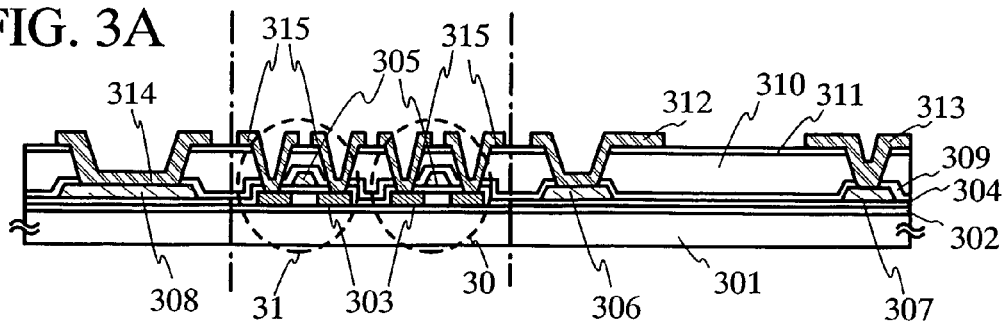
FIGS. 3A to 3D show Embodiment 1 of the present invention.

According to the above steps, top-gate type TFTs 30 and 31 having the poly-silicon film as the active layer can be manufactured, and a structure shown in FIG. 3A is obtained.

Figure 3B:
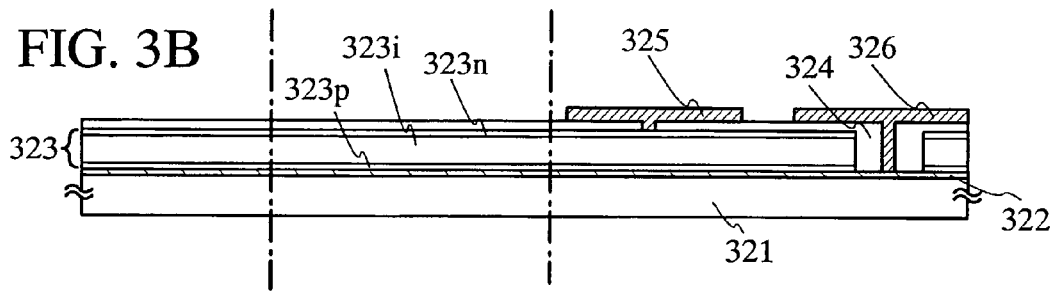

Next, a method for forming a photoelectric conversion element shown in FIG. 3B is described below.

A cathode electrode 322 is formed by forming a metal film, here a transparent conductive film, in 100 nm thick over a film substrate, which is a second substrate 321.

Next, a p-type semiconductor layer, an i-type (intrinsic) semiconductor layer, and an n-type semiconductor layer are stacked sequentially as a photoelectric conversion layer.

As the p-type semiconductor layer, a p-type microcrystal silicon film is formed in 50 nm thick by a PCVD method under the condition where the distance between electrodes is 36 mm; the film-forming pressure is 266 Pa; the RF power is 700 W; and $SiH_4$ (flow rate: 4 sccm), $B_2H_6$ (flow rate: 20 sccm), and $H_2$ (flow rate: 773 sccm) are used as the material gas. Alternatively, a p-type amorphous silicon film may be formed.

As the i-type (intrinsic) semiconductor layer, an i-type amorphous silicon film is formed in 600 nm thick by a PCVD method under the condition where the distance between electrodes is 36 mm; the film-forming pressure is 133 Pa; the RF power is 50 to 88 W; and $SiH_4$ (flow rate: 100 sccm) and $H_2$ (flow rate: 1000 sccm) are used as the material gas.

As the n-type semiconductor layer, an n-type microcrystal silicon film is formed in 70 nm thick by a PCVD method under the condition where the distance between electrodes is 33 mm; the film-forming pressure is 133 Pa; the RF power is 300 W; and $SiH_4$ (flow rate: 5 sccm), $PH_3$ (flow rate: 5 sccm), and $H_2$ (flow rate: 473 sccm) are used as the material gas. Alternatively, an n-type amorphous silicon film may be used.

Next, the stacked films of the p-type microcrystal silicon film, the i-type amorphous silicon film, and the n-type microcrystal silicon film are selectively removed by being scribed with the use of a YAG laser. This is to prevent an electrode to be formed afterward, which will connect to the cathode electrode, from contacting the n-type semiconductor layer of the photoelectric conversion layer.

According to these steps, photoelectric conversion layers 323n, 323i, and 323p are formed.

Subsequently, an insulating film 324 is formed so as to cover the photoelectric conversion layers. An acrylic resin film is formed as the insulating film 324 in this embodiment. Then, a resist mask is formed over the insulating film 324 by using a fifth photomask. Then, contact holes for an anode electrode and a wiring to connect with a cathode electrode are formed respectively by selectively etching or scribing with the use of a YAG laser the insulating film 324. In particular, the contact hole for the wiring to connect with the cathode electrode is formed in a portion where the stacked layers of the p-type microcrystal silicon film, the i-type amorphous silicon film, and the n-type microcrystal silicon film is partially removed in the previous step.

Then, after stacking a metal film over the insulating film 324, a resist mask is formed using a sixth photomask. Then, the stacked metal film is etched selectively by using the resist mask, and the anode electrode 325 and a terminal electrode 326 to connect with the cathode electrode are formed.

According to the above steps, a photodiode 323, which is the photoelectric conversion element, can be formed over the second substrate 321, and the structure shown in FIG. 3B is obtained.

Next, the first substrate 301 shown in FIG. 3A and the second substrate 321 shown in FIG. 3B are pasted with the use of an anisotropic conductive paste 331. At this time, it is preferable to paste them after adjusting the positions of these substrates. For example, alignment markers are formed to the first substrate and the second substrate in advance, and the substrates are pasted when their alignment markers correspond to each other. By fixing the both substrates while applying pressure thereto after their positions are adjusted, conductive particles 332 connect electrically the terminal electrode 326 and the wiring 313, and the anode electrode 325 and the wiring 312. According to the above steps, a semiconductor device with a function of a photo sensor can be manufactured.

A semiconductor device having a photo sensor manufactured in this embodiment, is described.

Figure 3C:
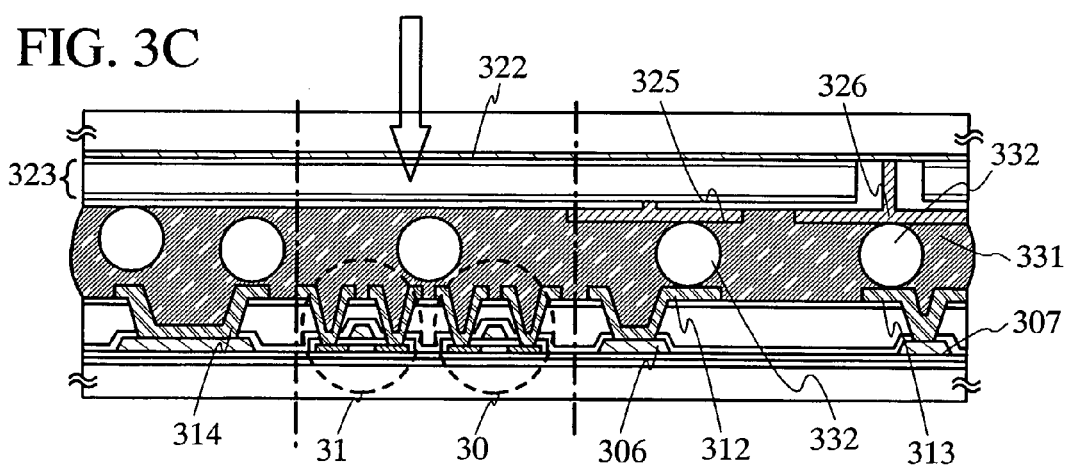

A photo sensor shown in FIG. 3C receives light which enters a photo diode 323 directly not through an amplifier circuit. That is to say, the photo sensor receives light from a side of the second substrate. Therefore, the second substrate 321 and the cathode electrode 322 are formed with a material having high light-transmitting properties. Moreover, the photo sensor may receive light from a side of the first substrate through the amplifier circuit. In this case, the first substrate and the other layers through which the light passes are formed with a material having high light-transmitting properties.

It is to be noted that the increase of a leak current due to the irradiation of a semiconductor layer 303 of TFTs 30 and 31 with light does not cause a problem basically unless the light has high energy. Moreover, when the light from the side of the second substrate is to be received, the light toward the semiconductor layer is blocked by the gate electrode 305 and the source or drain electrode 315. If the light toward the semiconductor layer 303 is blocked, at least one of the insulating film 324, the fourth interlayer insulating film 311, the third interlayer insulating film 310, and the second interlayer insulating film 309 may have light-blocking properties so as to prevent the light from entering the semiconductor layer 303. Further, the resin film of the insulating film 324 or the third interlayer insulating film 310 may have the light-blocking properties by dispersing black pigment or carbon therein. A conductive adhesion bond used when pasting the substrates, here the anisotropic conductive paste, may have the light-blocking properties.

When the light is to be received from a direction opposite to the light-reception direction of the semiconductor device shown in FIG. 3C, that is, from the side of the first substrate, a light-blocking film is preferably provided under the semiconductor layer to block the light which will enter the semiconductor layer.

The connection wiring 306 connects to the wiring 312 and extends to a channel formation region of the TFT 30 in the amplifier circuit to serve as a gate electrode. On the other hand, the connection wiring 306 is connected to the anode electrode 325 through a conductive particle 332 in the anisotropic conductive paste 331.

The connection wiring 307 connects to a wiring 313, and the wiring 313 connects to the terminal electrode 326, which connects with the cathode electrode 322, through the conductive particle 332 in the anisotropic conductive paste 331. Meanwhile, the connection wiring 307 connects to the source or drain electrode 315 of the TFT 31.

Figure 3D:
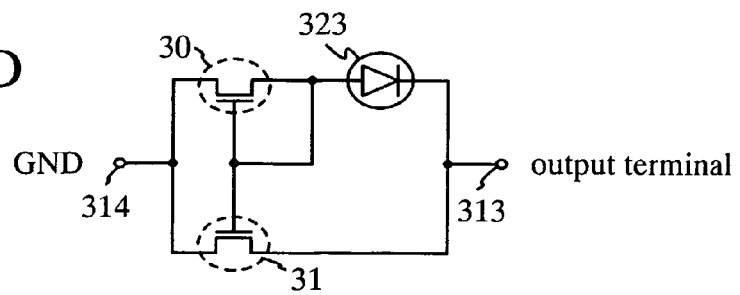

FIG. 3D is an equivalent circuit diagram of a two-terminal photo sensor shown in FIG. 3C. In order to amplify the output value of the PIN type photodiode 323, the amplifier circuit is constituted by a current mirror circuit including the TFTs 30 and 31. Although FIG. 3C shows one TFT 30 and one TFT 31, actually, two TFTs 30 (channel size L/W=8 μm/50 μm) can be connected in parallel and ten TFTs 31 (channel size L/W=8 μm/50 μm) can be connected in parallel in order to increase the output value by five times. In this embodiment, one TFT 30 and a hundred TFTs 31 are provided in parallel to increase the output value by a hundred times.

Although a TFT constituting a part of the circuit shown in FIG. 3D is an N-type TFT, a P-type TFT may be used.

A photo sensor shown in FIG. 3D is mounted through the wirings 313 and 314, and then connected to the outside. The wiring 314 is connected to an external power source GND, while the wiring 313 is connected to an output terminal. Moreover, in order to amplify the output value, the amplifier circuit may be constituted by an operational amplifier in which n-channel TFTs or p-channel TFTs are combined appropriately. In this case, the number of terminals is five. By using the operational amplifier for the amplifier circuit and using a level shifter, the number of power sources can be decreased so that the number of terminals is decreased to four.

Although the n-channel TFTs 30 and 31 are top-gate type TFTs of single-gate structures, each TFT may have a double-gate structure to decrease the variation. Further, in order to decrease the off-current value, the n-channel TFTs 30 and 31 may have an LDD (Lightly Doped Drain) structure. The LDD structure is a structure in which a lightly-doped region with an impurity element (referred to as an LDD region) is provided between the channel formation region and the source or drain region which is a heavily-doped region with an impurity element. The LDD structure has an effect of relaxing an electric field near the drain to prevent the deterioration due to the hot-carrier injection. In addition, in order to prevent the deterioration of the on-current value due to the hot-carrier injection, the n-channel TFTs 30 and 31 may have a GOLD (Gate-drain Overlapped LDD) structure. The GOLD structure in which the LDD region is overlapped with the gate electrode through the gate insulating film is more effective than the LDD structure to relax an electric field near the drain so as to prevent the deterioration due to the hot-carrier injection. By providing such a GOLD structure, it is possible to relax the electric field near the drain and to suppress the hot-carrier injection and the deterioration phenomenon.

Since the i-type semiconductor layer in the photoelectric conversion layer is formed with amorphous silicon in this embodiment, the semiconductor device is preferable as the photo sensor. This is because the photo sensor using the amorphous silicon has high sensitivity to a wavelength of approximately 580 to 600 nm, which is in the middle of the wavelengths of the visible light region, and has a sensing characteristic which is approximate to human visibility.

In particular, a diode-type photo sensor has advantages that the response speed is high and dynamic range due to the brightness and darkness of light is wide. However, since the amount of an electric current by the photo charge is small, an element for amplifying the photo charge is necessary. However, since the photo sensor of this embodiment has the TFT using poly-silicon as the amplifier element, the photo sensor which has high electrical characteristic and which can respond with high speed can be achieved. In other words, the photo sensor according to the present embodiment in which the photoelectric conversion layer is formed with amorphous silicon and the amplifier element is formed using the poly-silicon TFT is effective because the photo sensor can also detect even an extremely small amount of current.

According to the above reasons, in this embodiment, an active layer of the thin film transistor constituting a part of the amplifier circuit is obtained by crystallizing the amorphous silicon film. However, a crystalline semiconductor film may be used as the active layer from the beginning. Further, as long as the active layer has a function for amplifying the output of the photoelectric conversion element, the active layer may be a microcrystal semiconductor film or an amorphous semiconductor film. In this case, a plastic substrate or a substrate formed using an organic resin material not having enough heat resistance can be used as the first substrate.

This embodiment can be combined freely with Embodiment Mode 1 or 2.

Embodiment 2

Figure 4:
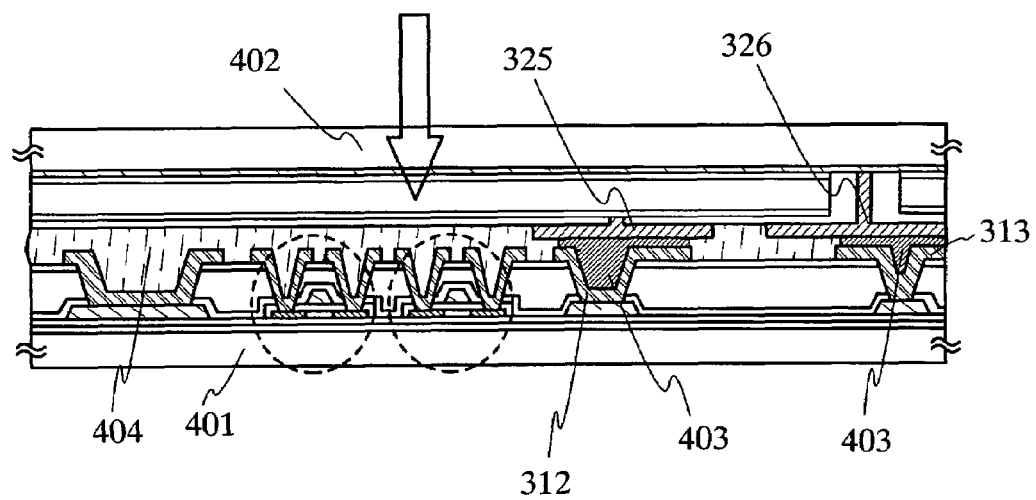
FIG. 4 shows Embodiment 2 of the present invention.

This embodiment describes a connection method using solder shown in Embodiment Mode 1 more specifically with reference to FIG. 4. In FIG. 4, the same parts as those in FIGS. 3A to 3D are denoted with the same reference numerals, and description to such parts is omitted.

Similarly to Embodiment 1, in this embodiment, an amplifier circuit is formed over a first substrate as shown in FIG. 3A and a photoelectric conversion element is formed over a second substrate as shown in FIG. 3B.

However, in the case of pasting the photoelectric conversion element and the thin film transistor with solder, the first and second substrates need to have heat resistance enough to resist the solder reflow process (a process temperature is approximately 250° C.). Here, glass substrates are used as a first substrate 401 and a second substrate 402.

Further, the wiring 312, the wiring 313, the anode electrode 325, and the terminal electrode 326 need to be formed with a metal capable of forming an alloy with solder, that is, a metal having wettability to solder. Specifically, a metal such as nickel, copper, gold, silver, or the like is used. Alternatively, a metal film formed with nickel, copper, gold, silver, or the like is formed over only parts of the surfaces of the wiring 312, the wiring 313, the anode electrode 325, and the terminal electrode 326, which contact solder.

Then, as shown in FIG. 4, the first substrate and the second substrate are opposed so that the amplifier circuit and the photoelectric conversion element, which serves as a photodiode, are located between the substrates. At this time, similarly to Embodiment 1, solder 403 is used to connect the anode electrode 325 and the wiring 312, and the terminal electrode 326 and the wiring 313 after the positions of both substrates are adjusted.

After soldering, the space between the photoelectric conversion element and the amplifier circuit is sealed with a sealing material 404. As the sealing material 404, a sealing resin formed with an organic insulating material is used, and the sealing resin is flowed into the space to be sealed. An acrylic resin film is used here.

The semiconductor device manufactured in this embodiment, similarly to Embodiment 1, receives light which enters the photo diode directly not through the amplifier circuit. Therefore, the second substrate and the cathode electrode preferably have high light-transmitting properties. Moreover, in order to prevent the increase of the leak current due to the light irradiation of the semiconductor layer of the TFT, the sealing material 404 may have the light-blocking properties in addition to the light-blocking method described in Embodiment 1. Further, the semiconductor device may receive light from the side of the first substrate.

This embodiment can be freely combined with any one of Embodiment Modes 1 and 2 and Embodiment 1.

Embodiment 3

This embodiment describes a method for peeling, from the photo sensor manufactured by pasting the first and second substrates shown in Embodiment Mode 2, at least one of the first and second substrates and transposing the photo sensor more specifically with reference to FIGS. 5A to 5D. In particular, a method for peeling the substrate with physical means is described. An amplifier circuit and a photoelectric conversion element are formed according to the same steps as those in Embodiment 1 except the step of forming a peeling layer. Therefore, in FIGS. 5A to 5D, the same parts as those in FIGS. 3A to 3D are denoted with the same reference numerals, and description to such parts is omitted.

Figure 5A:
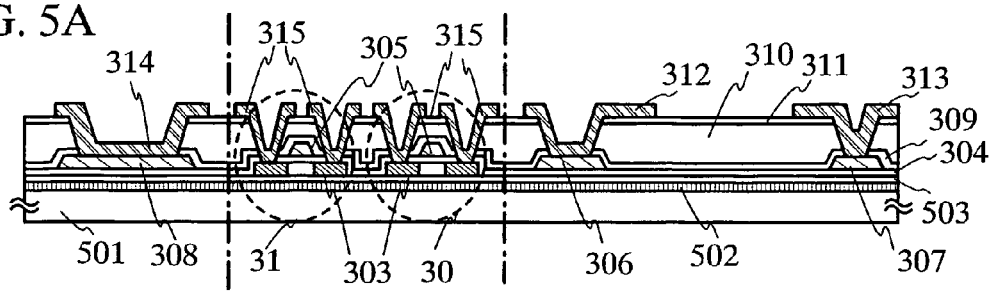
FIGS. 5A to 5D show Embodiment 3 of the present invention.

First, a thin film transistor constituting a part of the amplifier circuit is formed over a glass substrate (a first substrate 501) shown in FIG. 5A, and a metal film 502 is formed as a peeling layer over the first glass substrate 501 by a sputtering method. In this embodiment, a tungsten film is formed as the metal film 502 under the condition for suppressing the film stress where the Ar flow rate is 100 sccm, the film-forming pressure is 2 Pa, the film-forming power is 4 kW, the substrate temperature is 200° C., and the film thickness is 10 to 200 nm, preferably 50 to 75 nm. Moreover, without being exposed to the air, an oxide film, which is the first layer of a base insulating film 503, is formed over the metal film 502. In this embodiment, a silicon oxide film is formed as the oxide film in thickness from 150 to 200 nm by the sputtering method. The oxide film is desirably twice or more as thick as the metal film.

When the base insulating film 503 is stacked over the metal film 502, an amorphous metal oxide film (a tungsten oxide film) is formed in approximately 2 to 5 nm thick between the metal film 502 and the silicon oxide film, and this amorphous metal oxide film also serves as a part of the peeling layer. When the first substrate is peeled in the later step, separation occurs in the tungsten oxide film, at the interface between the tungsten oxide film and the silicon oxide film, or at the interface between the tungsten oxide film and the tungsten film. Instead of the tungsten film, a single layer or stacked layers formed with an element selected from the group consisting of Ti, Ta, Mo, Nd, Ni, Co, Zr, Zn, Ru, Rh, Pd, Os, and Ir; or formed with an alloy material or chemical compound material including any one of the above elements as its main constituent can be used. For example, a single layer or stacked layers formed with nitride of any one of the above elements, such as titanium nitride, tungsten nitride, tantalum nitride, or molybdenum nitride can be used.

It is to be noted that the metal film 502 and the first layer of the base insulating film are also formed at an edge surface of the substrate by the sputtering method. Therefore, it is preferable to remove selectively the tungsten film, the tungsten oxide film, and the silicon oxide film formed at the edge surface of the substrate by dry etching which uses $SF_6$ gas and He gas and by $O_2$ ashing. This step is performed after forming the amorphous silicon film.

Next, a silicon oxynitride film, which is the second layer of the base insulating film 503, is formed in 100 nm thick by a PCVD method. Then, without exposing the substrate to the air, an amorphous silicon film including hydrogen is formed in 54 nm thick over the silicon oxynitride film. The silicon oxynitride film serves as a blocking layer which prevents the diffusion of an impurity element such as an alkali metal from the glass substrate.

After forming the silicon oxynitride film as the second layer, the amorphous silicon film including hydrogen is formed and crystallized. Specific methods for forming and crystallizing the amorphous silicon film are the same as those in Embodiment 1.

When heat treatment at 410° C. or more is performed to crystallize the amorphous silicon film, the amorphous metal oxide film between the metal film 502 and the silicon oxide film is crystallized, and a metal oxide film having the crystal structure is obtained. After this heat treatment at 410° C. or more is completed, separation can be caused in the inside of the tungsten oxide film; at the interface between the tungsten oxide film and the silicon oxide film; or at the interface between the tungsten oxide film and the tungsten film by adding a comparatively small force (for example, a man's hand, air pressure of gas blown from a nozzle, ultrasonic waves, or the like). It is noted that when the heat treatment is performed at the temperature that is high enough to obtain the metal oxide film having the crystal structure, the composition of the metal oxide film changes and the metal oxide film becomes thinner slightly. Moreover, the tungsten oxide film having the crystal structure has plural kinds of crystal structures ($WO_2$, $WO_3$, $WO_x$ ($2<x<3$)) and $WO_3$ changes into $WO_2$ or $WO_x$ by the heat treatment.

After that, similarly to Embodiment 1, the semiconductor layer 303, the gate insulating film 304, and the gate electrode 305 are stacked, and the amplifier circuit is formed over the first substrate 501.

Figure 5B:
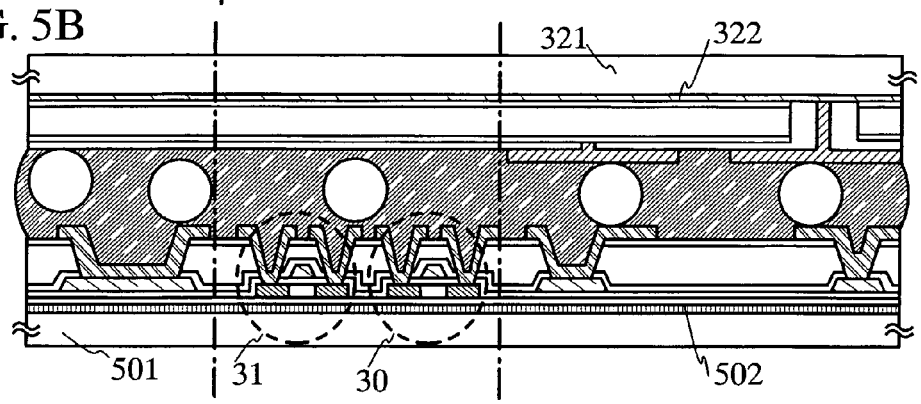

The first substrate 501 formed thus and the second substrate 321 over which the photoelectric conversion element shown in FIG. 3B is formed are adhered with an anisotropic conductive paste, thereby obtaining a state of FIG. 5B. Although the substrates are pasted with the anisotropic conductive paste, the method shown in Embodiment 2 with FIG. 4 may be employed in which the solder as the metal layer and the sealing resin are used. Further, the component sandwiched between the second substrate 321 with the photoelectric conversion element formed thereover and the first substrate 501 with the thin film transistor formed thereover only serve to connect the photoelectric conversion element and the thin film transistor electrically and does not need to have adhesion function. In this case, an adhesion bond or the like may be applied to the side surface of the semiconductor device so that both substrates are adhered.

Next, a process for partially lowering the adhesiveness between the metal film 502 and the metal oxide film, or the adhesiveness between the metal oxide film and the base insulating film 503 is performed so as to facilitate the peeling of the first substrate. The process for partially lowering the adhesiveness includes a step of irradiating a part of the metal oxide film with the laser beam along a rim of the region to be peeled, or a step of applying pressure locally from the outside along the rim of the region to be peeled so as to give a damage to an inside of the layer of the metal oxide film or to a part of the interface of the metal oxide film. Specifically, a hard needle such as a diamond pen may be pressed vertically and moved while applying load thereto. It is preferable to use a scriber apparatus and to move the hard needle in the range from 0.1 to 2 mm while applying the pressure. Thus, it is important to form a portion where the peeling is likely to occur, which is a trigger, before the peeling step. By lowering the adhesiveness selectively (partially) in advance, the defective peeling can be prevented and the yield can be increased.

Figure 5C:
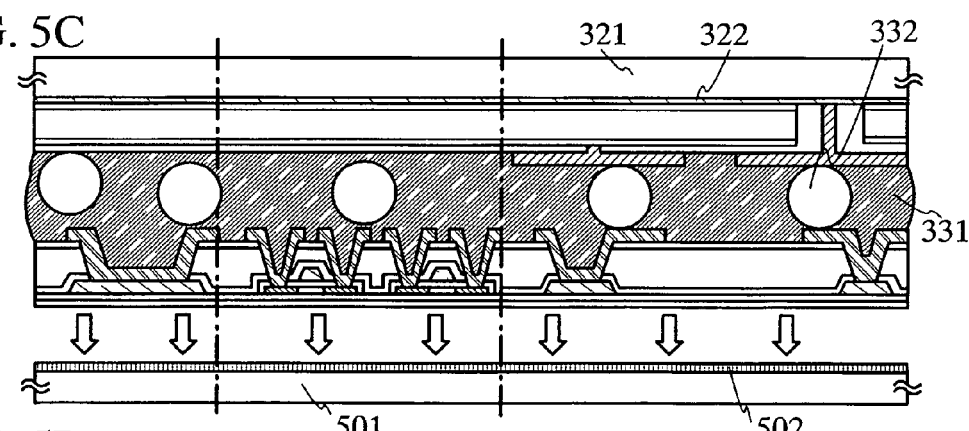

Next, the first substrate 501 with the metal film 502 formed is peeled by physical means from the region where the adhesiveness is partially lowered by the above process. The first substrate 501 can be peeled by a comparatively small force (for example a man's hand, air pressure of gas blown from a nozzle, ultrasonic waves, or the like). Thus, the insulating film 503 can be separated from the first substrate 501. FIG. 5C shows the state after the first substrate 501 is peeled.

Figure 5D:
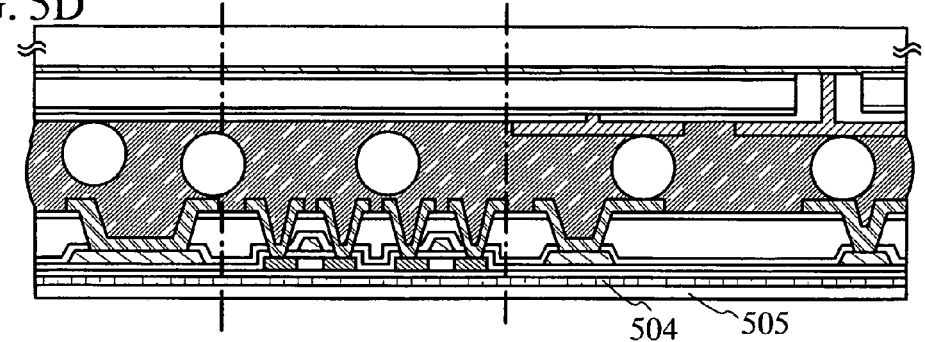

Next, the third substrate 505, which is the film substrate, and the base insulating film 503 (and the layer to be peeled) are pasted by an adhesion bond 504 (FIG. 5D). As the adhesion bond 504, there are various adhesion bonds, for example a UV-curable adhesion bond, a photo-curable adhesion bond such as a thermosetting adhesion bond and an anaerobic adhesion bond.

According to the above process, the photo sensor equipped with the amplifier circuit including the TFTs transposed to the third substrate 505, which is the film substrate, can be prepared.

Although this embodiment describes a method for transposing the photo sensor after peeling the first substrate, another method may be employed in which the peeling layer of this embodiment is provided between the second substrate 321 and the cathode electrode 322 and the photo sensor is transposed after peeling the second substrate. Alternatively, the photo sensor may be transposed after peeling both of the first and second substrates.

When the amplifier circuit is formed using TFTs having high electrical characteristic (typically field-effect mobility), it is necessary to use a substrate having high heat resistance, such as a glass substrate or a quartz substrate. However, according to the present embodiment, the amplifier circuit formed over the glass substrate or the like can be directly transposed to a substrate not having high heat resistance such as a film substrate, a plastic substrate, or a substrate formed with a resin material. This makes it possible to manufacture a thin, lightweight, and flexible photo sensor. Moreover, a photo sensor in which impact resistance is improved and which can resist bending and twisting can be achieved. Further, since the photo sensor formed over the film substrate, the plastic substrate, or the substrate formed with the resin material is flexible, the photo sensor can be mounted to any object, and mount strength can be improved.

When the photoelectric conversion element is formed with the amorphous silicon film or the microcrystal silicon film, the second substrate may be any kind of substrate not depending on the heat resistance. However, when the amplifier circuit is formed using TFTs having high electrical characteristic, it is necessary to use the glass substrate, the quartz substrate, or the like having high heat resistance as the first substrate. In this case, when the first substrate over which the amplifier circuit is formed is peeled and the photo sensor is transposed to the third substrate, which is the film substrate or the plastic substrate, based on this embodiment, a photo sensor sandwiched between a pair of film substrates or a pair of plastic substrates can be obtained.

Moreover, in the case of pasting the first substrate and the second substrate by a solder reflow process, the material of the substrate is restricted due to the temperature in the solder reflow process. Specifically, since the solder reflow process is performed at approximately 250° C., the second substrate over which the photoelectric conversion element is formed with the amorphous silicon film needs to have heat resistance to some extent.

Therefore, when the photo sensor is manufactured by being pasted with the solder and both of the first and second substrates are made of glass or quartz, it is possible to peel one or both of the substrates and to transpose the photo sensor to a thin and lightweight substrate. Thus, a lightweight and flexible photo sensor can be manufactured.

This embodiment can be freely combined with any one of Embodiment Modes 1 and 2 and Embodiments 1 and 2.

Embodiment 4

This embodiment describes a peeling method, which is different from the peeling method shown in Embodiment 3, with reference to FIGS. 6A to 6E. In particular, a method for peeling the substrate with chemical means is described. It is to be noted that steps of forming an amplifier circuit and a photoelectric conversion element in this embodiment are the same as those shown in Embodiment 1 except the step of forming a peeling layer. Therefore, in FIGS. 6A to 6E, the same parts as those in FIGS. 3A to 3D are denoted with the same reference numerals, and description to such parts is omitted.

Figure 6A:
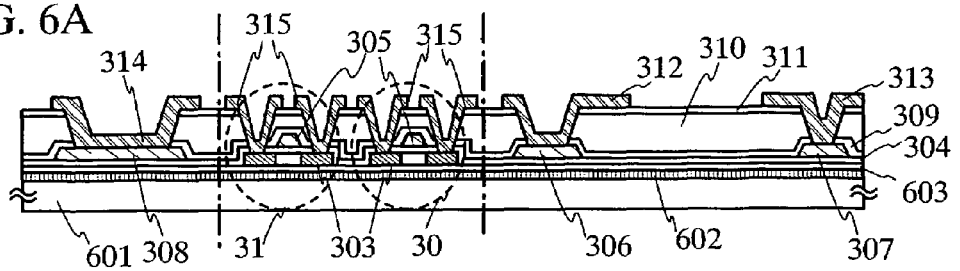
FIGS. 6A to 6E show Embodiment 4 of the present invention.

First, a thin film transistor constituting a part of an amplifier circuit is formed over a glass substrate (a first substrate 601) shown in FIG. 6A. Then, a peeling layer 602 is formed over the first substrate 601.

The peeling layer 602 may comprise silicon whose structure is an amorphous semiconductor, a semi-amorphous semiconductor having an amorphous semiconductor and a crystalline semiconductor (also referred to as an SAS), or a crystalline semiconductor. The SAS includes a microcrystal semiconductor in which a crystal grain having a size of 0.5 to 20 nm is observed in the amorphous semiconductor. The peeling layer can be formed by the sputtering method, the plasma CVD method, or the like. The peeling layer may be formed in thickness from 30 nm to 1 μm; however, the peeling layer can be formed in thickness less than 30 nm when a film-forming apparatus can form a film in thickness less than 30 nm.

Further, an element such as phosphorus or boron may be added in the peeling layer. The element may be activated by heating or the like. By adding the element to the peeling layer, it is possible to improve the reaction speed of the peeling layer, that is, the etching rate.

Although this embodiment uses an SAS having a thickness from 30 nm to 1 μm, preferably from 30 to 50 nm as the peeling layer 602, other materials described above may be used.

In order not to etch the semiconductor layer, the base insulating film 603 over the peeling layer 602 is preferably formed with an insulating material containing oxygen or nitrogen, such as silicon oxide ($SiO_x$), silicon nitride ($SiN_x$), silicon oxynitride ($SiO_xN_y$ (x>y)), or silicon nitride oxide ($SiN_xO_y$) (x>y) (x, y=1, 2 . . . ), in a single-layer structure or a multilayer structure. This is because enough selective ratio to the peeling layer can be obtained with respect to the etching gas used when peeling the first substrate 601.

For this reason, the base insulating film may have the multilayer structure. The base insulating film 603 in this embodiment has a three-layer structure including a silicon oxide film, a silicon oxynitride film, and another silicon oxide film. It is preferable to use the silicon oxynitride film as the base insulating film in consideration of the diffusion of the impurity element from the first substrate or the like. However, the silicon oxynitride film has low adhesiveness to the peeling layer and the semiconductor layer. Consequently, the silicon oxide films, which have high adhesiveness to the peeling layer, the semiconductor layer, and the silicon oxynitride film, are formed so as to sandwich the silicon oxynitride film therebetween.

The steps up to forming the amplifier circuit and the wirings over the first substrate after forming the base insulating film 603 are the same as those in Embodiment 1; therefore the description is omitted here.

Next, a method for forming the photoelectric conversion element over the second substrate 321, which is the film substrate, is described with reference to FIG. 6B. A cathode electrode 322, and p-type, i-type (intrinsic), and n-type semiconductor layers as photoelectric conversion layers are stacked sequentially over the second substrate 321 in the same way as Embodiment 1.

Next, after forming all the photoelectric conversion layers, the stacked amorphous silicon film and microcrystal silicon film are selectively etched using a resist mask, which has been formed using a photo mask, so as to form photoelectric conversion layers 604n, 604i, and 604p. In this step, the etching is performed so that the photoelectric conversion layers are covered in three directions by an insulating film formed in the next step. This is to prevent the photoelectric conversion layers from reacting with the etchant and being etched together in the following step of peeling the first substrate.

Next, an insulating film 605 is formed so as to cover the photoelectric conversion layer, and then a contact hole is formed in the insulating film. Further, a terminal electrode 326 connecting with the anode electrode 325 and the cathode electrode 322 is formed.

Figure 6B:
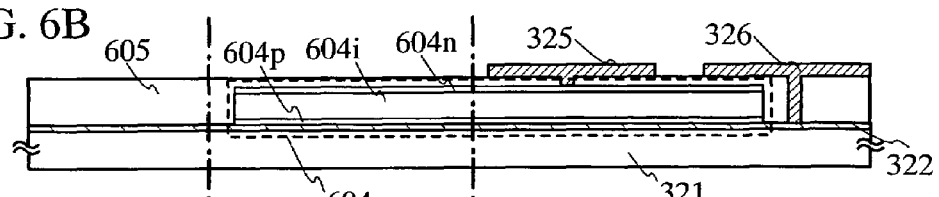

According to the above steps, a photodiode 604, which is the photoelectric conversion element formed over the second substrate 321, can be manufactured, and a structure shown in FIG. 6B is obtained.

Figure 6C:
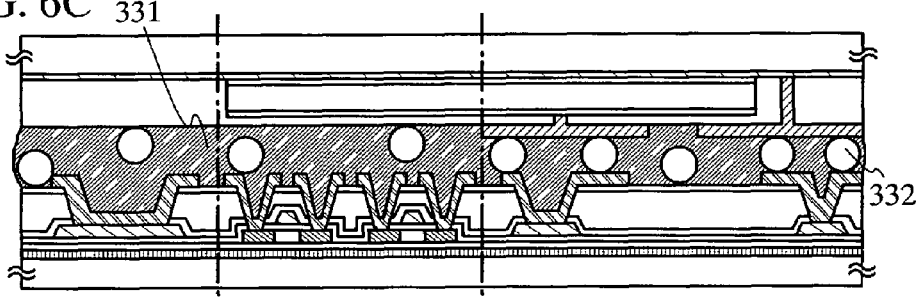

Next, the first substrate 601 and the second substrate 321 are pasted with the anisotropic conductive paste as shown in Embodiment 1, and a structure shown in FIG. 6C is obtained. Although the substrates are pasted with the anisotropic conductive paste 331, the substrates may be pasted with solder as shown in Embodiment 2 when the second substrate 321 can resist the heat in the solder reflow process.

Figure 6D:
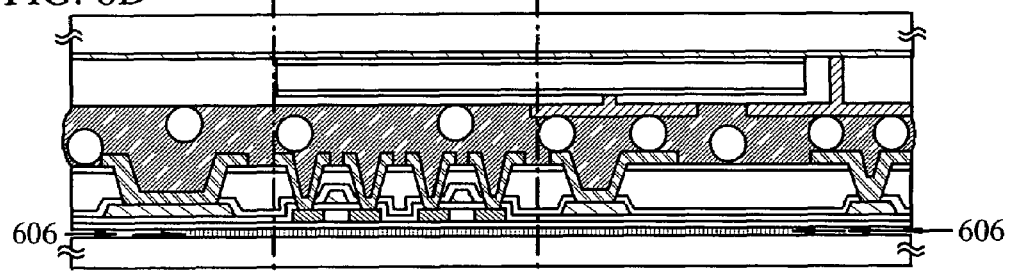

From the state of FIG. 6C, the peeling layer 602 is removed. As shown in FIG. 6D, etchant 606 to remove the peeling layer 602 is introduced. As the etchant 606, gas or liquid containing halogen fluoride can be used. For example, as halogen fluoride, $ClF_3$ (chlorine trifluoride) can be used. $ClF_3$ can be formed by reacting chlorine with fluorine at 200° C. or more through the process of $Cl_2(g)+3F_2(g) \rightarrow 2ClF_3(g)$. $ClF_3$ may be liquid depending on the temperature of reaction room (boiling point 11.75° C.). When $ClF_3$ is liquid, wet etching may be employed which uses liquid containing halogen fluoride. As another gas containing halogen fluoride, gas in which nitrogen is mixed in $ClF_3$ or the like may be used.

Moreover, the etchant is not limited to $ClF_3$ and other halogen fluoride when the etchant can etch the peeling layer 602 and does not etch the base insulating film 603. For example, gas containing fluorine such as $CF_4$, $SF_6$, $NF_3$, or $F_2$ which has become plasma can be used. As another etchant, a strong alkali solution such as tetramethyl ammonium hydroxide (TMAH) can be used.

Further, the combination of the peeling layer and the base insulating film is not limited to the above material, when a material which can be selectively etched is used as the peeling layer and a material not etched is used as the base film, in the case of removing the peeling layer 602 chemically by the gas containing halogen fluoride such as $ClF_3$.

In this embodiment, the peeling layer can be removed by a low-pressure CVD apparatus under the condition where $ClF_3$ (chlorine trifluoride) gas is used as the etchant, the temperature is 350° C., the flow rate is 300 sccm, the air pressure is 6 Torr, and the time is three hours. However, the condition is not limited to this.

Further, heating means, for example a heater, may be provided at a side surface of the low-pressure CVD apparatus. When the process temperature is set to 100 to 300° C. by the heating means, the reaction speed of the peeling layer and the etchant can be increased. Thus, the amount of the etchant can be reduced, thereby shortening the process time.

The introducing of such etchant can make the peeling layer gradually recede and remove the peeling layer.

When the etchant is introduced, the etchant, the gas flow rate, the temperature, and the like are set so that the semiconductor layer 303 and the photoelectric conversion layer of the photodiode 604 are not etched. Since $ClF_3$ used in this embodiment has the characteristic to etch silicon selectively, the peeling layer can be removed selectively. It is preferable to use an insulating film containing oxygen or nitrogen as the base insulating film and the insulating film covering the photoelectric conversion layer so as not to etch the semiconductor layer 303 and the insulating film covering the photoelectric conversion layer. Since the reaction speed of these peeling layer, base insulating film, and the insulating film covering the photoelectric conversion layer to the etchant has difference, that is, the selective ratio of the etchant is high, it is possible to remove the peeling layer easily while protecting the amplifier circuit and the photoelectric conversion layer. In this embodiment, it is possible to prevent the semiconductor layer from reacting with the etchant by the gate insulating film and the base insulating film provided over and under semiconductor layer 303.

Figure 6E:
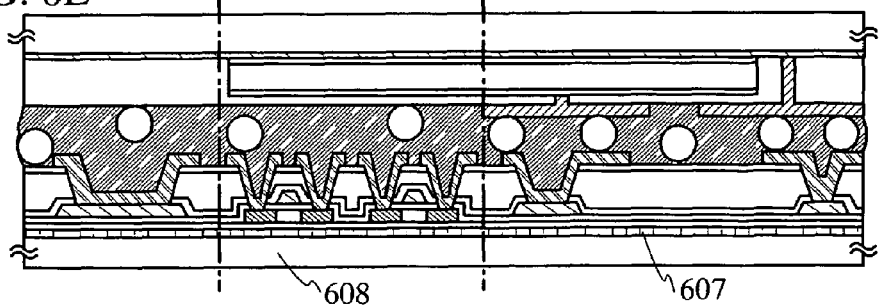

After that, the first substrate 601 is peeled. Next, as shown in FIG. 6E, the amplifier circuit and the photodiode supported by the second substrate can be adhered to a third substrate 608 using an adhesion bond 607. The third substrate 608 is preferably a flexible substrate. As the flexible substrate, a substrate formed with plastic typified by polyethylene terephthalate (PET), polyethylene naphthalate (PEN), and polyethersulfone (PES), or flexible synthetic resin such as acrylic, and polyimde can be used.

As the adhesion bond 607, an adhesion bond formed with a thermosetting resin, a UV-curable resin, an epoxy resin, or the like, or a two-sided tape can be used.

Since the semiconductor device having the photo sensor, is transposed to the flexible substrate, the flexibility of the device can be improved, and the breaking strength can be enhanced. Compared with the photo sensor formed over the first substrate, which is the glass substrate, the photo sensor according to the present invention can be made thinner, more lightweight, and more flexible.

This embodiment can be freely combined with any one of Embodiment Modes 1 and 2, and Embodiments 1 to 3.

Embodiment 5

In this embodiment, after forming a plurality of amplifier circuits over a first substrate and forming a plurality of photoelectric conversion elements over a second substrate, the first and second substrates are pasted. After that, the substrates are cut into each photo sensor to obtain a plurality of semiconductor devices each of which has a photo sensor as shown in FIG. 7.

Figure 7A:
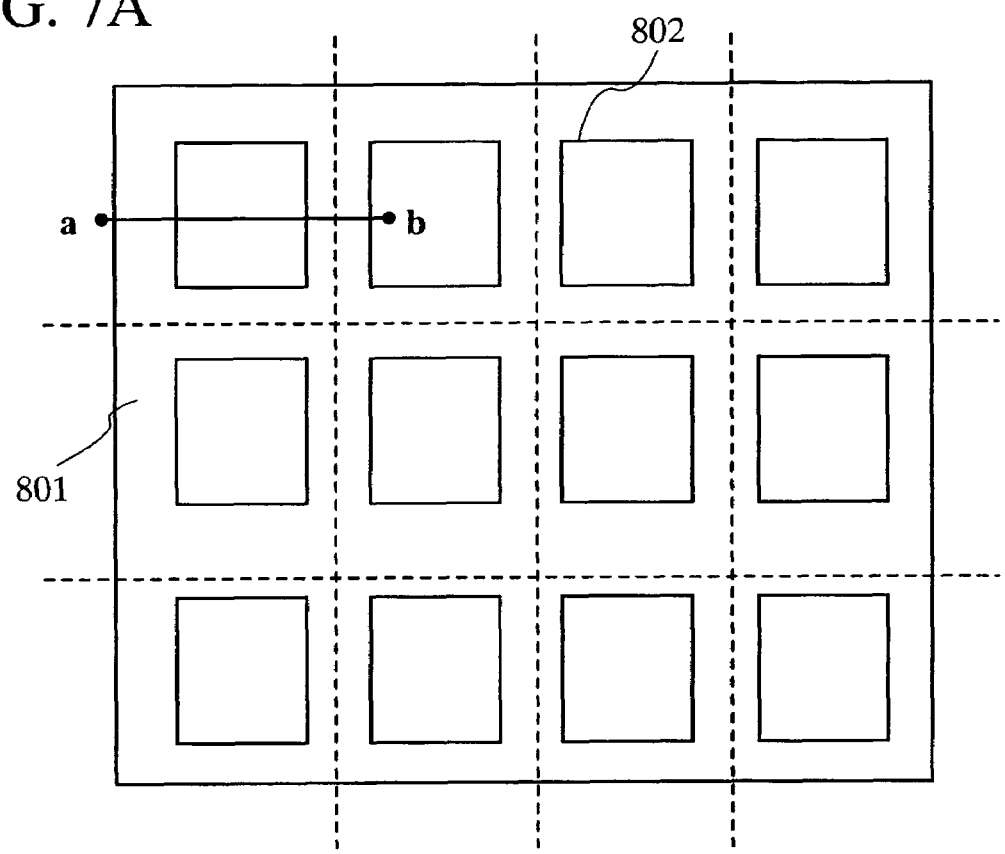
FIGS. 7A and 7B show Embodiment 5 of the present invention.

A plurality of amplifier elements or amplifier circuits shown in Embodiment 1 with FIG. 3A are formed in a matrix pattern over the first substrate. On the other hand, a plurality of photoelectric conversion elements are formed in a matrix pattern over the second substrate. By pasting the first and second substrates according to the pasting method described in any one of Embodiment Modes 1 and 2 and Embodiments 1 and 2, semiconductor devices 802 of the present invention are manufactured in a matrix pattern. FIG. 7A does not illustrate the second substrate 803 but illustrates only the first substrate 801 and the semiconductor devices 802. Then, a plurality of semiconductor devices each having a photo sensor function can be manufactured at one time by cutting the substrate with a laser, a dicer, or the like along a dotted line.

In the case of peeling the first substrate as shown in Embodiment 4 after pasting the substrates, a peeling layer 804 is preferably formed selectively to the first substrate 801. Thus, the time taken for peeling can be shortened. Further, a hole 805 reaching the peeling layer over a part of the substrate is preferably formed. According to this step, since an etching gas 806 enters through the hole 805 and reacts with the peeling layer, the reaction proceeds fast, thereby shortening the etching time further. Although the hole is formed in the second substrate 803 in FIG. 7B, the hole may be formed in the first substrate 801. In the case of providing the hole in the substrate, it is preferable to form the hole between the semiconductor devices 802.

This embodiment can be freely combined with any one of Embodiment Modes 1 and 2 and Embodiments 1 to 4.

Embodiment 6

This embodiment describes an example in which a semiconductor device manufactured according to the present invention is applied to an active type image sensor.

Figure 8:
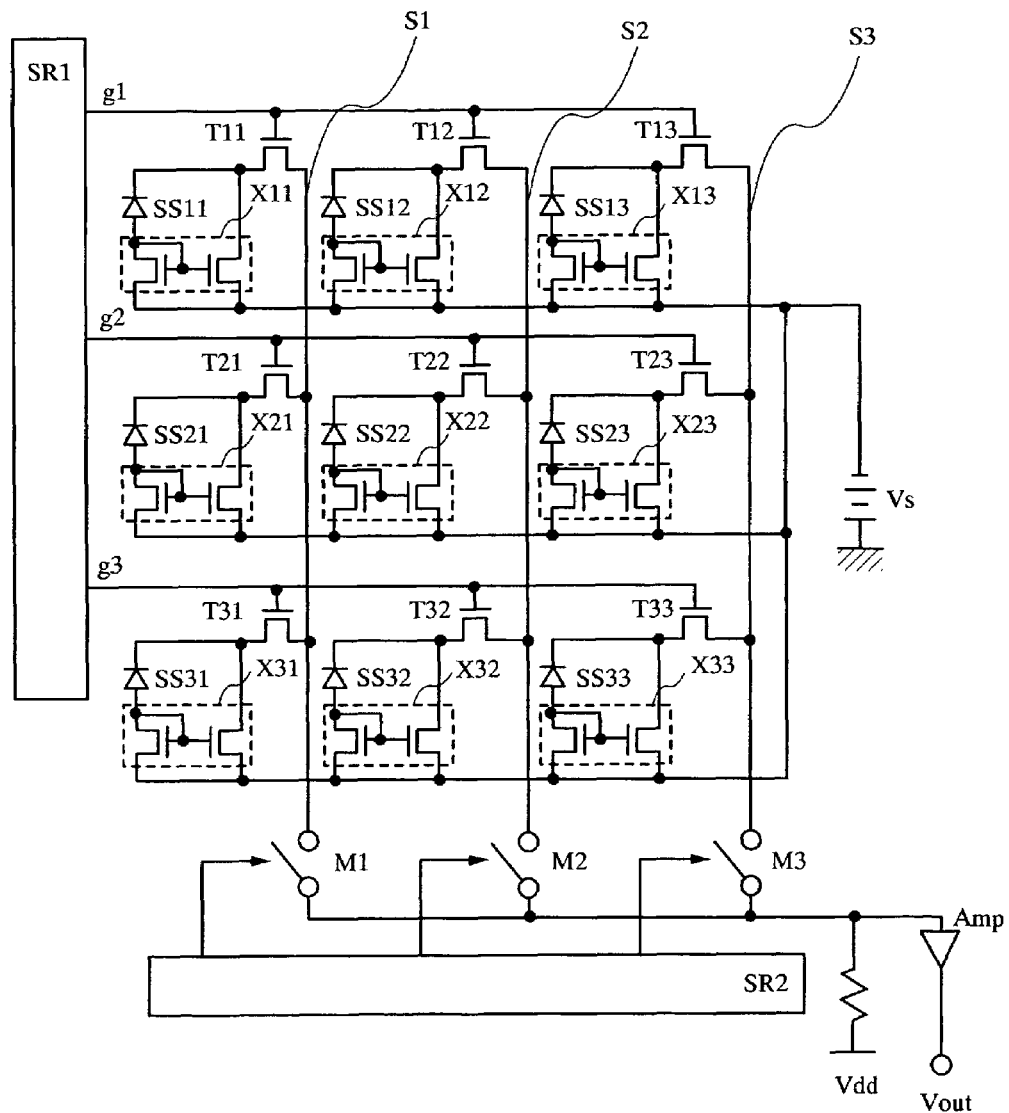
FIG. 8 shows Embodiment 6 of the present invention.

FIG. 8 is an equivalent circuit diagram in the case of arranging equivalent circuits of two-terminal photo sensors shown in FIG. 3D in 3×3 pattern. Its driving method is described with reference to FIG. 8.

A shift register SR1 is connected to gate signal lines g1 to g3. The shift register SR1 selects each gate signal line. First, when the gate signal line g1 is selected, transfer transistors T11 to T13 connected to the gate signal line g1 are turned on. This outputs signals of diodes SS11 to SS13, which have been amplified in amplifier circuit X11 to X13, to signal wirings S1 to S3 through the transfer transistors T11 to T13. A shift register SR2 is connected to transfer switches M1 to M3 and selects each of the transfer switches M1 to M3. When the transfer switch M1 is selected by the shift register SR2, the signal of the signal wiring S1 is amplified in a buffer amplifier (Amp) and outputted to Vout. After that, sequentially, the transfer switches M2 and M3 are selected, and signals of the signal wirings S2 and S3 are amplified and outputted.

Next, the gate signal line g2 is selected by the shift register SR1. Such steps are repeated to read out signals of each pixel, that is, each diode.

In the case of manufacturing an image sensor, peripheral circuits such as the shift registers SR1 and SR2, and a charge-transfer transistor are manufactured in addition to the photo sensor. These peripheral circuits and charge-transfer transistor are preferably formed over the substrate simultaneously as manufacturing TFTs of the amplifier circuit. After that, the substrate over which the photoelectric conversion element is formed and the substrate over which the peripheral circuit, the charge-transfer transistor, and the amplifier circuit are formed are pasted so that an image sensor is manufactured.

Alternatively, the charge-transfer transistor and the amplifier circuit may be manufactured over the same substrate, and the peripheral circuits may be connected separately.

Figure 7B:
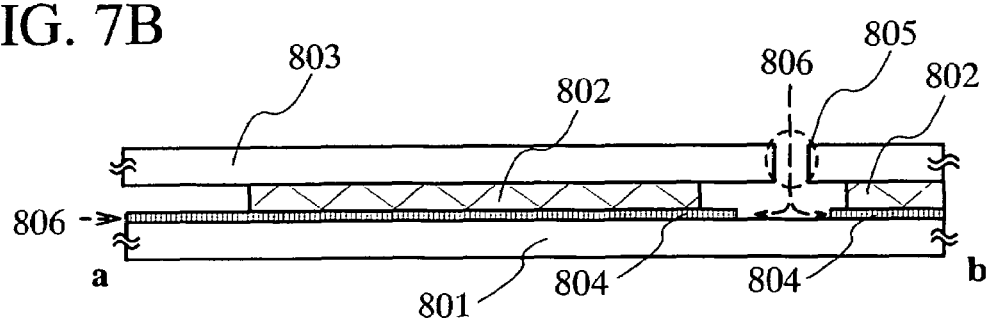

The image sensor manufactured in this embodiment can be the semiconductor device comprising a plurality of photo sensors over a plastic substrate. In the case of peeling the substrate, as shown in FIG. 7B, it is effective to selectively form the peeling layer or form a hole reaching the peeling layer, because the time taken for peeling can be shortened.

The semiconductor device formed according to this embodiment can have a structure comprising a plurality of photo sensors each of which include a diode and the amplifier element formed using the TFTs. The diode is formed with amorphous silicon and microcrystal silicon, and the TFTs are formed with poly-silicon. Therefore, although the area of the photoelectric conversion layer (light-reception layer) is small, that is, compact, even an extremely small amount of light can be detected, and the semiconductor device has high sensitivity and high definition. Further, since the semiconductor device is formed over the plastic substrate, it is possible to make the semiconductor device thinner and more lightweight. With the anisotropic conductive film used to connect with the power source line or the driver circuit such as the shift register, the semiconductor device can be set over the package constituting a part of a power source circuit, a driver circuit, an IC chip, or the like formed over the print wiring substrate. Thus, the light-reception area of a photoelectric conversion device can be enlarged, and the area of the print wiring substrate can be made small.

Although this embodiment describes the active sensor, the semiconductor device having the photo sensor manufactured according to the present invention, can also be applied to a passive sensor.

This embodiment can be freely combined with any one of Embodiment Modes 1 and 2 and Embodiments 1 to 5.

Embodiment 7

Figure 9:
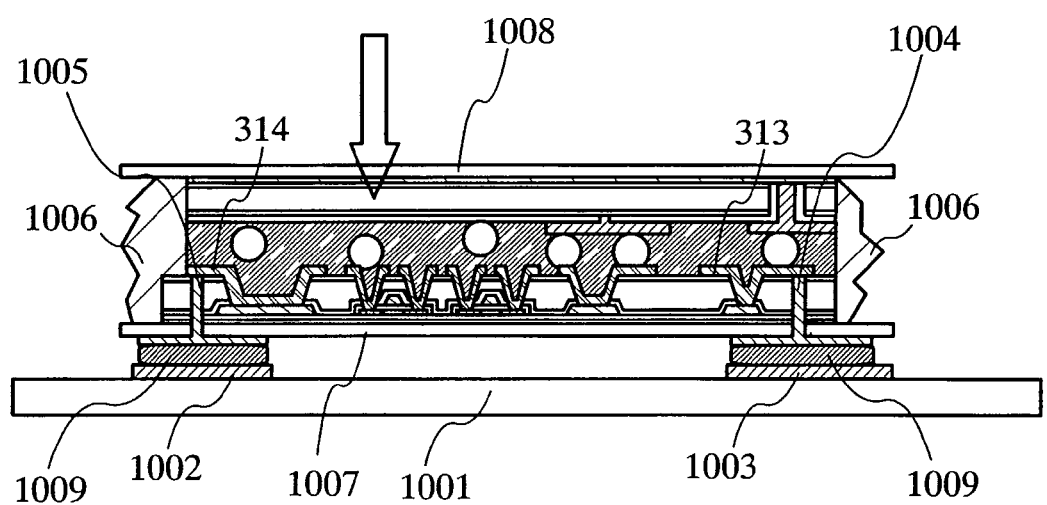
FIG. 9 shows a method for mounting a semiconductor device of the present invention.

This embodiment describes an example in which the semiconductor device manufactured according to the present invention is mounted with reference to FIG. 9. Specifically, the semiconductor device manufactured according to Embodiment 1 shown in FIGS. 3A to 3D is mounted. Therefore, in FIG. 9, the same parts as those in FIGS. 3A to 3D are denoted with the same reference numerals, and description to such parts is omitted.

In FIG. 9, the semiconductor device manufactured according to the present invention is mounted to an object, that is, a print wiring substrate 1001 in this embodiment. Electrodes 1002 and 1003 are formed over the print wiring substrate 1001. Further, electrodes 1004 and 1005 connecting with the wirings 313 and 314 of the semiconductor device are also formed. Then, the electrodes 1002 and 1005, and the electrodes 1003 and 1004 are connected by solder 1009 and mounted. In this structure, a substrate 1007 is preferably a flexible substrate because the mount strength can be drastically increased.

A side surface of the semiconductor device is sealed with a sealing material 1006. When a conductive film and the like sandwiched between the photoelectric conversion element and the thin film transistor does not have an adhesive function, the sealing material 1006 may have the adhesive function so that the substrates can be pasted.

In this embodiment, the substrate 1007 is adhered to the print wiring substrate 1001 by solder, and mounted. Therefore, the photoelectric conversion element receives light passed through the substrate 1008. However, the form of mounting is not limited to that in this embodiment. For example, the semiconductor device may be rotated by 180° and the substrate 1008 may be adhered to the print wiring substrate 1001 by solder, and receive light passed through the substrate 1007. Further, the device may be mounted with a conductive adhesion bond instead of the solder. In this case, the side surface of the semiconductor device is preferably sealed simultaneously as mounting the device with the conductive adhesion bond.

Embodiment 8

Figure 10:
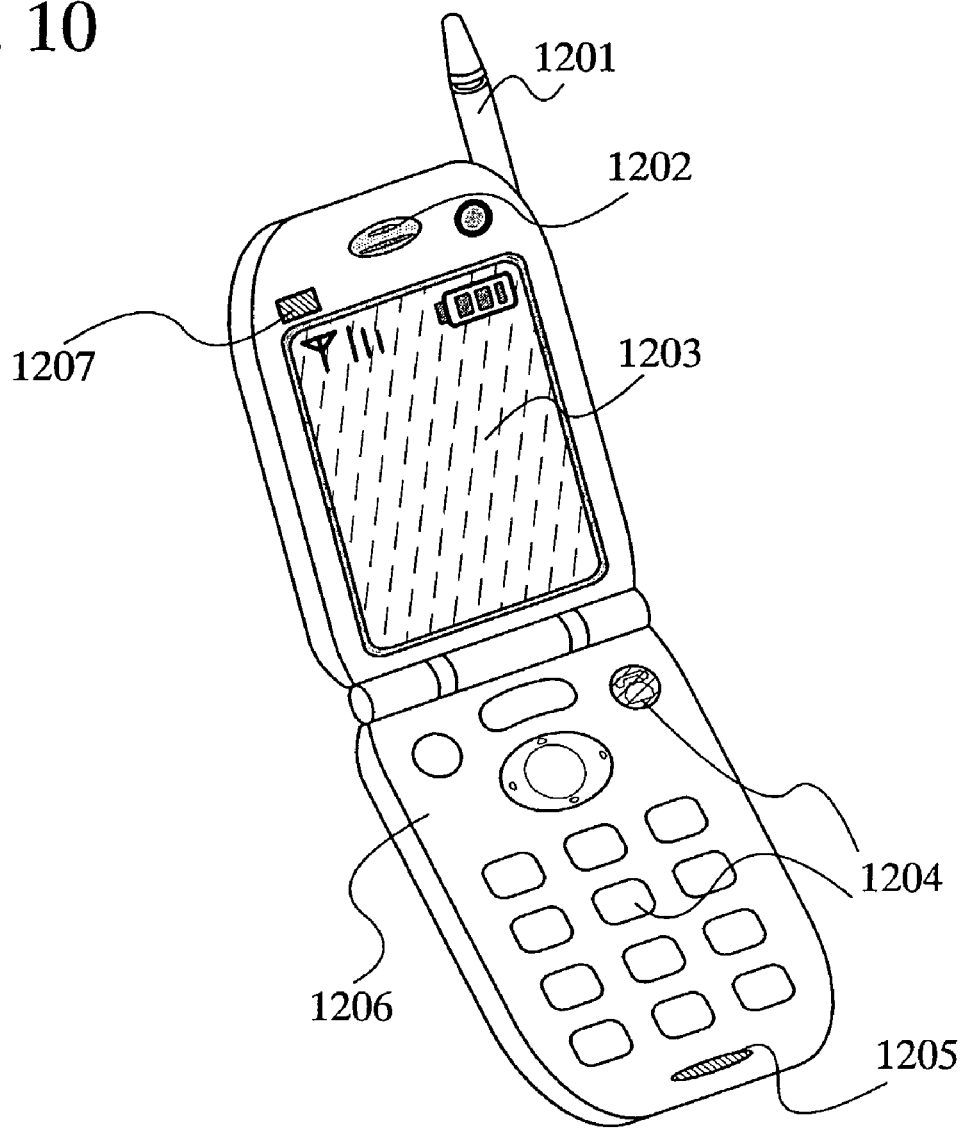
FIG. 10 shows a cellular phone to which a semiconductor device of the present invention is mounted.
Figure 11A:
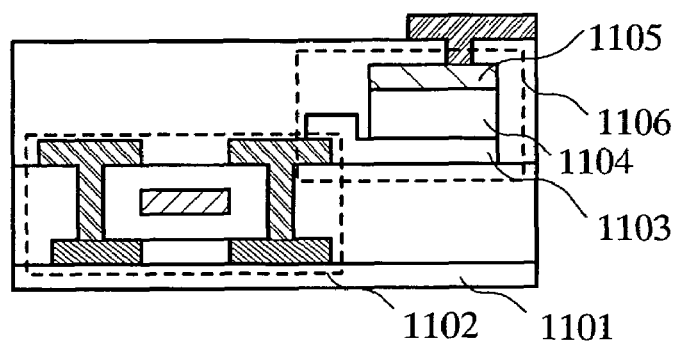
FIGS. 11A and 11B show a conventional example of the present invention.
Figure 11B:
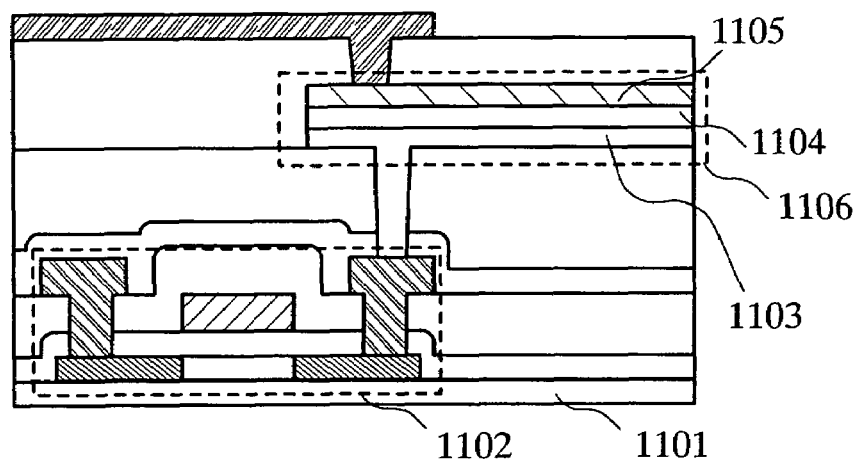

This embodiment shows an example in which a cellular phone is completed by applying the present invention with reference to FIG. 10. The cellular phone comprises a main body 1206, an audio output portion 1202, an audio input portion 1205, a display portion 1203, operation switches 1204, an antenna 1201, and a semiconductor device 1207. By providing the semiconductor device 1207 according to the present invention near the display portion 1203, the brightness of the circumstance under which the cellular phone is used can be measured. Based on the measured value, the luminance of the backlight of the cellular phone can be controlled appropriately. This can achieve the cellular phone with low power consumption.

Since the semiconductor device 1207 according to the present invention is thin and lightweight, the semiconductor device 1207 does not interrupt the other parts although the device is mounted inside the case of the cellular phone. Moreover, the total weight of the cellular phone does not increase that much.

The invention claimed is:

1. A method of manufacturing a semiconductor device comprising:
   forming a peeling layer over a first substrate;
   forming a thin film transistor and a wiring, over the peeling layer;
   forming a photoelectric conversion element including a photoelectric conversion layer between an anode electrode and a cathode electrode, and a terminal electrode electrically connected to the cathode electrode, over a second substrate;
   pasting the first substrate and the second substrate which are opposed to each other through a conductive film by sandwiching the conductive film and a sealing material to make an electrical connection between the thin film transistor and the anode electrode and an electrical connection between the wiring and the terminal electrode so that the thin film transistor, the photoelectric conversion element, the wiring and the terminal electrode are located between the first and second substrates; and
   peeling the first substrate from the thin film transistor while keeping the thin film transistor and the photoelectric conversion element held by the second substrate.

2. The method for manufacturing a semiconductor device according to claim 1,
   wherein after peeling the first substrate, a third substrate is pasted to the thin film transistor.

3. The method for manufacturing a semiconductor device according to claim 2,
   wherein the third substrate is a plastic substrate or a substrate formed with an organic resin material.

4. The method for manufacturing a semiconductor device according to claim 1,
wherein after peeling the first substrate, a third substrate is pasted to the thin film transistor.

5. The method for manufacturing a semiconductor device according to claim 4,
wherein the third substrate is a plastic substrate or a substrate formed with an organic resin material.

6. The method for manufacturing a semiconductor device according to claim 1,
wherein the first substrate is a glass substrate or a quartz substrate.

7. The method for manufacturing a semiconductor device according to claim 1,
wherein a circuit comprising the thin film transistor amplifies an output of the photoelectric conversion element.

\* \* \* \* \*

UNITED STATES PATENT AND TRADEMARK OFFICE
CERTIFICATE OF CORRECTION

PATENT NO. : 7,691,686 B2 Page 1 of 1
APPLICATION NO. : 11/579141
DATED : April 6, 2010
INVENTOR(S) : Kazuo Nishi et al.

It is certified that error appears in the above-identified patent and that said Letters Patent is hereby corrected as shown below:

At column 8, line 24, please change "continuous continuous" to --continuous--.

Signed and Sealed this

Thirteenth Day of July, 2010

David J. Kappos
*Director of the United States Patent and Trademark Office*